(12) United States Patent  
McPartlin et al.

(10) Patent No.: US 10,790,788 B2  
(45) Date of Patent: Sep. 29, 2020

(54) DIRECT SUBSTRATE TO SOLDER BUMP CONNECTION FOR THERMAL MANAGEMENT IN FLIP CHIP AMPLIFIERS

(71) Applicant: Skyworks Solutions, Inc., Irvine, CA (US)

(72) Inventors: Michael Joseph McPartlin, North Andover, MA (US); Bharatjeet Singh Gill, Ottawa (CA); Stephen Joseph Kovacic, Ottawa (CA)

(73) Assignee: Skyworks Solutions, Inc., Irvine, CA (US)

( * ) Notice: Subject to any disclaimer, the term of this patent is extended or adjusted under 35 U.S.C. 154(b) by 56 days.

(21) Appl. No.: 16/056,251

(22) Filed: Aug. 6, 2018

(65) Prior Publication Data

US 2019/0028067 A1   Jan. 24, 2019

Related U.S. Application Data

(63) Continuation of application No. 15/299,738, filed on Oct. 21, 2016, now Pat. No. 10,069,466.
(Continued)

(51) Int. Cl.
*H03F 1/30* (2006.01)
*H01L 23/31* (2006.01)
(Continued)

(52) U.S. Cl.
CPC ......... *H03F 1/302* (2013.01); *H01L 21/4853* (2013.01); *H01L 21/4882* (2013.01); *H01L 21/8222* (2013.01); *H01L 23/3114* (2013.01); *H01L 23/3142* (2013.01); *H01L 23/3157* (2013.01); *H01L 23/36* (2013.01); *H01L 23/367* (2013.01); *H01L 23/3675* (2013.01); *H01L 23/3736* (2013.01); *H01L 23/3738* (2013.01); *H01L 23/49816* (2013.01); *H01L 23/49844* (2013.01); *H01L 23/528* (2013.01); *H01L 23/5223* (2013.01); *H01L 23/5286* (2013.01); *H01L 23/53214* (2013.01); *H01L 23/53228* (2013.01); *H01L 23/66* (2013.01); *H01L 24/05* (2013.01); *H01L 24/11* (2013.01); *H01L 24/13* (2013.01); *H01L 25/50* (2013.01); *H01L 27/0647* (2013.01); *H01L 27/0658* (2013.01); *H01L 28/20* (2013.01); *H01L 28/40* (2013.01); *H01L 29/1004* (2013.01); *H01L 29/16* (2013.01); *H01L 29/161* (2013.01); *H01L 29/41708* (2013.01); *H01L 29/732* (2013.01); *H01L 29/7325* (2013.01); *H03F 1/56* (2013.01);
(Continued)

(58) Field of Classification Search
CPC ...................................................... H03F 1/302
USPC ............................................................ 330/289
See application file for complete search history.

(56) References Cited

U.S. PATENT DOCUMENTS 4,263,563 A   4/1981  Congdon
5,696,466 A   12/1997 Li
(Continued)

*Primary Examiner* — Patricia T Nguyen
(74) *Attorney, Agent, or Firm* — Knobbe, Martens, Olson & Bear, LLP

(57) ABSTRACT

Solder bumps are placed in direct contact with the silicon substrate of an amplifier integrated circuit having a flip chip configuration. A plurality of amplifier transistor arrays generate waste heat that promotes thermal run away of the amplifier if not directed out of the integrated circuit. The waste heat flows through the thermally conductive silicon substrate and out the solder bump to a heat-sinking plane of an interposer connected to the amplifier integrated circuit via the solder bumps.

19 Claims, 15 Drawing Sheets

Related U.S. Application Data

(60) Provisional application No. 62/245,168, filed on Oct. 22, 2015, provisional application No. 62/245,183, filed on Oct. 22, 2015.

(51) Int. Cl.

| | |
|---|---|
| *H01L 25/00* | (2006.01) |
| *H01L 23/00* | (2006.01) |
| *H01L 23/373* | (2006.01) |
| *H01L 23/367* | (2006.01) |
| *H01L 23/498* | (2006.01) |
| *H01L 21/48* | (2006.01) |
| *H03F 3/195* | (2006.01) |
| *H03F 3/24* | (2006.01) |
| *H04B 1/44* | (2006.01) |
| *H03F 3/21* | (2006.01) |
| *H01L 29/732* | (2006.01) |
| *H01L 23/36* | (2006.01) |
| *H01L 29/161* | (2006.01) |
| *H01L 21/8222* | (2006.01) |
| *H01L 23/528* | (2006.01) |
| *H01L 23/66* | (2006.01) |
| *H01L 27/06* | (2006.01) |
| *H01L 49/02* | (2006.01) |
| *H03F 1/56* | (2006.01) |
| *H03F 3/213* | (2006.01) |
| *H04B 1/04* | (2006.01) |
| *H04B 1/48* | (2006.01) |
| *H01L 23/522* | (2006.01) |
| *H01L 23/532* | (2006.01) |
| *H01L 29/10* | (2006.01) |
| *H01L 29/16* | (2006.01) |
| *H01L 29/417* | (2006.01) |
| *H04W 88/02* | (2009.01) |

(52) U.S. Cl.
CPC ............ *H03F 3/195* (2013.01); *H03F 3/211* (2013.01); *H03F 3/213* (2013.01); *H03F 3/24* (2013.01); *H03F 3/245* (2013.01); *H04B 1/0475* (2013.01); *H04B 1/44* (2013.01); *H04B 1/48* (2013.01); *H01L 2223/6655* (2013.01); *H01L 2224/0401* (2013.01); *H01L 2224/05647* (2013.01); *H01L 2224/131* (2013.01); *H01L 2224/1302* (2013.01); *H01L 2224/13147* (2013.01); *H01L 2224/13647* (2013.01); *H01L 2224/16145* (2013.01); *H01L 2224/16227* (2013.01); *H01L 2224/16235* (2013.01); *H01L 2224/32225* (2013.01); *H01L 2224/73204* (2013.01); *H01L 2224/81447* (2013.01); *H01L 2924/10253* (2013.01); *H01L 2924/10271* (2013.01); *H01L 2924/1207* (2013.01); *H01L 2924/1305* (2013.01); *H03F 2200/387* (2013.01); *H03F 2200/447* (2013.01); *H03F 2200/451* (2013.01); *H04B 2001/0408* (2013.01); *H04W 88/02* (2013.01)

(56) References Cited

U.S. PATENT DOCUMENTS

| | | |
|---|---|---|
| 5,841,184 A | 11/1998 | Li |
| 6,611,172 B1 | 8/2003 | Kobayashi |
| 6,801,555 B1 | 10/2004 | DiJaili |
| 7,142,058 B2 | 11/2006 | Bokatius |
| 9,563,586 B2 | 2/2017 | Herbeck |
| 9,653,586 B2 | 5/2017 | Dungan |
| 10,069,466 B2 | 9/2018 | McPartlin |
| 10,177,716 B2 | 1/2019 | McPartlin |
| 10,181,824 B2 | 1/2019 | McPartlin |
| 10,193,504 B2 | 1/2019 | McPartlin |
| 10,447,210 B2 | 10/2019 | McPartlin |
| 2002/0084854 A1 | 7/2002 | Apel |
| 2004/0027153 A1 | 2/2004 | Satou et al. |
| 2004/0099879 A1 | 5/2004 | Chen |
| 2005/0189996 A1 | 9/2005 | Kobayashi |
| 2007/0207585 A1 | 9/2007 | El-Kareh |
| 2009/0085066 A1 | 4/2009 | Preisler |
| 2009/0152680 A1 | 6/2009 | Voldman |
| 2012/0068224 A1 | 3/2012 | Nishikawa et al. |
| 2012/0108188 A1 | 5/2012 | Matsumoto |
| 2012/0218047 A1 | 8/2012 | Costa et al. |
| 2012/0262231 A1 | 10/2012 | Scandiuzzo et al. |
| 2013/0242448 A1 | 9/2013 | Salcedo et al. |
| 2014/0131860 A1 | 5/2014 | Kanda |
| 2014/0292415 A1 | 10/2014 | Kovacic |
| 2015/0341075 A1 | 11/2015 | Heikkinen |
| 2016/0380088 A1 | 12/2016 | Camillo-Castillo et al. |
| 2017/0117204 A1 | 4/2017 | McPartlin et al. |
| 2017/0117270 A1 | 4/2017 | McPartlin et al. |
| 2017/0117853 A1 | 4/2017 | McPartlin et al. |
| 2017/0117857 A1 | 4/2017 | McPartlin et al. |
| 2017/0288616 A1 | 10/2017 | Goto |
| 2018/0006614 A1 | 1/2018 | Hoogzaad et al. |
| 2018/0019329 A1 | 1/2018 | McPartlin |
| 2019/0123693 A1 | 4/2019 | McPartlin et al. |
| 2019/0199294 A1 | 6/2019 | McPartlin et al. |

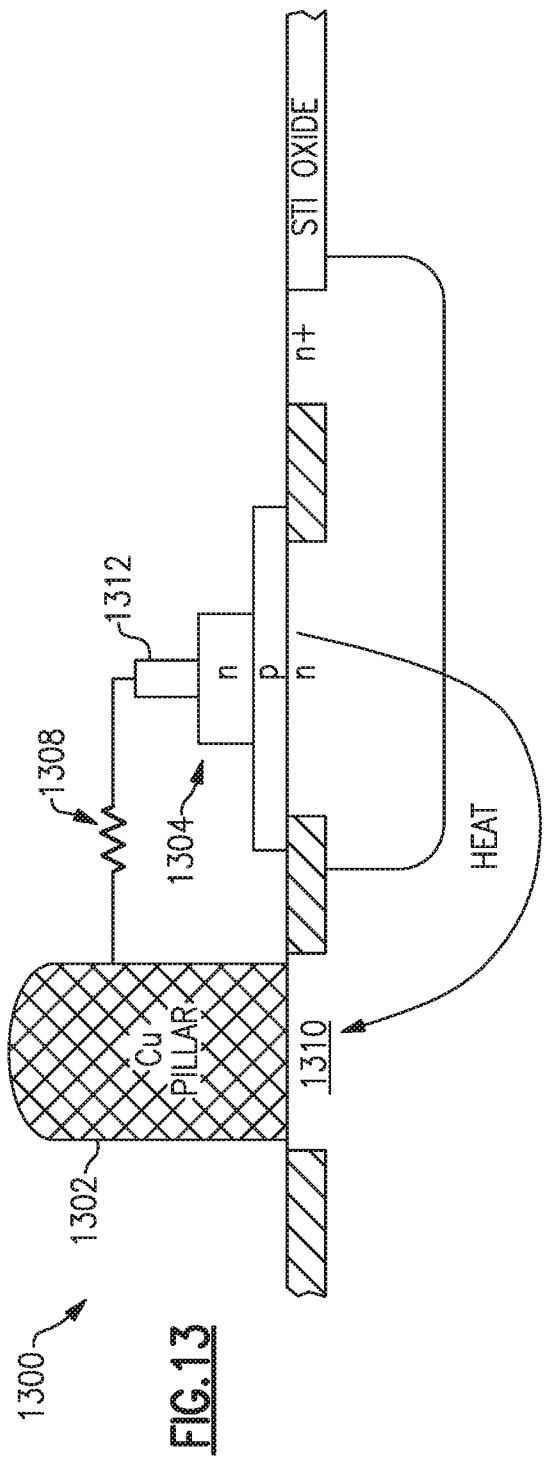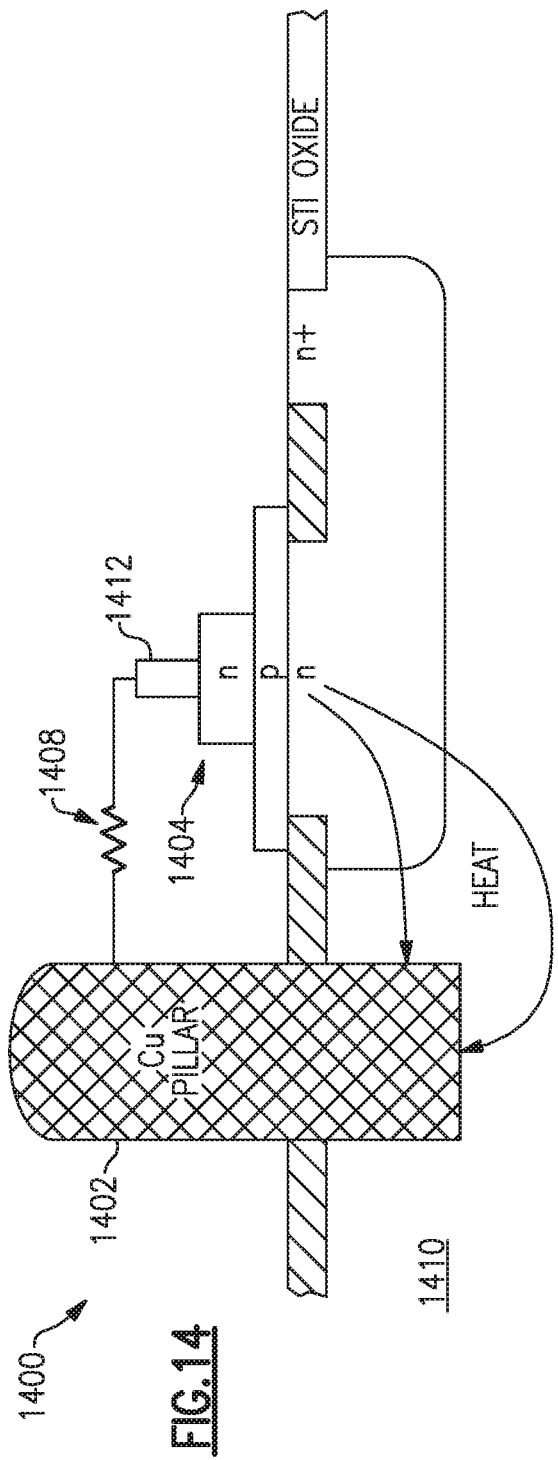

DIRECT SUBSTRATE TO SOLDER BUMP CONNECTION FOR THERMAL MANAGEMENT IN FLIP CHIP AMPLIFIERS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Embodiments relate to power-amplifier design, and in particular to managing electrothermal performance in flip-chip power-amplifier design.

SUMMARY

In an embodiment, an alternative bumping method for linear flip-chip SiGe-power-amplifier IC design implements emitter ballasting and achieves equivalent or lower thermal resistance to that obtained with direct emitter bumping and base ballasting.

In another embodiment, the metal bump or pillars are placed adjacent to the NPN transistor arrays that are used in the power amplifier for RF power generation. By placing the metal in intimate contact with the silicon substrate, the heat generated by the NPN arrays flows down into the silicon substrate and then out the metal bump/pillar. Advantageously, the metal bump/pillar also forms an electrical ground connection in close proximity to the NPN array and, consequently, the emitter ballast resistors can be connected to the grounding point.

In yet another embodiment, a method to provide equivalent or lower thermal resistance for a SiGe NPN array of a power amplifier relative to the emitter bumping method is disclosed. In an embodiment, the Cu pillar connects directly to the bulk silicon substrate adjacent to the NPN transistor array. The metal area and contact-via area is maximized to the extent of the bump pad to provide less thermal resistance without increasing the die area. The heat generated in each emitter stripe of the transistor array is more efficiently transferred to the bulk silicon rather than to the polysilicon-emitter-contact via because of the physical differences in the top side versus the backside contact surface area of the integrated circuit (IC) or chip. Since the bulk silicon has relatively high thermal conductivity, the heat generated in the NPN transistor array spreads quickly and is efficiently transferred to a large silicon contact pad and Cu pillar.

In a further embodiment, the Cu pillar bump electrically and thermally connects to the bulk silicon and not to the emitter contact. A ballast resistor can be electrically connected and physically placed between each emitter of the NPN transistor array and the bump pad, which in an embodiment, optimizes the electrothermal configuration or layout for a linear SiGe power amplifier.

According to a number of embodiments, the disclosure relates to a method to implement an emitter-ballasted amplifier in a flip chip configuration. The method comprises forming at least one transistor over a silicon substrate, forming a metal pillar with respect to the silicon substrate such that a bottom of the metal pillar is in direct contact with the silicon substrate, and forming a first resistor in electrical communication with an emitter of the at least one transistor and with the metal pillar, heat generated during operation of the emitter-ballasted amplifier being transferred through the silicon substrate to the bottom of the metal pillar. In an embodiment, the method further comprises forming the metal pillar in a cavity etched into the silicon substrate such that the metal pillar protrudes outwards and upwards from the cavity, the bottom and at least a portion of the side of the metal pillar in direct contact with the silicon substrate.

In an embodiment, the metal pillar is configured to provide a flip chip interconnection for the emitter-ballasted amplifier. In another embodiment, the metal pillar is configured to form a part of a thermal path for heat generated by the at least one transistor when the emitter-ballasted amplifier is operating. In a further embodiment, the metal pillar does not extend over the base of the at least one transistor. In a yet further embodiment, the metal pillar does not extend over any significant portion of the at least one transistor.

In an embodiment, the metal pillar is configured to provide a ground connection. In another embodiment, the method further comprises forming a second resistor in communication with a base of the at least one transistor. In a further embodiment, the metal pillar includes copper. In a yet further embodiment, the metal pillar forms at least one solder bump of a flip chip.

In an embodiment, the at least one transistor includes an NPN bipolar junction transistor. In another embodiment, the emitter-ballasted amplifier includes a SiGe power amplifier.

Certain embodiments relate to an emitter-ballasted amplifier comprising at least one transistor formed over a silicon substrate, a metal pillar formed with respect to the silicon substrate such that a bottom of the metal pillar is in direct contact with the silicon substrate, and a first resistor in communication with an emitter of the at least one transistor and with the metal pillar, heat generated during operation of the at least one transistor being transferred through the silicon substrate to the bottom of the metal pillar. In an embodiment, the emitter-ballasted amplifier further comprises a cavity etched into the silicon substrate, the metal pillar formed within the cavity such that the metal pillar protrudes outwards and upwards from the cavity, the bottom and at least a portion of the side of the metal pillar in direct contact with the silicon substrate.

In an embodiment, the metal pillar is configured to provide a flip chip interconnection. In another embodiment, the metal pillar is configured to form a part of a thermal path for heat generated by the at least one transistor. In a further embodiment, the metal pillar is configured to provide a ground connection. In a yet further embodiment, the metal pillar forms at least one solder bump of a flip chip.

According to further embodiments, the disclosure related to a wireless mobile device comprising an antenna configured to receive and transmit radio frequency (RF) signals, a transmit/receive switch configured to pass an amplified RF signal to the antenna for transmission, and a multi-chip module including a flip chip amplifier die that includes at least one emitter-ballasted amplifier configured to amplify an RF input signal and to generate the amplified RF signal, where the at least one emitter-ballasted amplifier includes at least one transistor formed over a silicon substrate, a metal pillar formed with respect to the silicon substrate such that a bottom of the metal pillar is in direct contact with the silicon substrate, and a first resistor in communication with an emitter of the at least one transistor and the metal pillar, and an output matching network die including an output matching network circuit configured to match an impedance of a fundamental frequency of the amplified RF signal. In an embodiment, the at least one emitter-ballasted amplifier further includes a second resistor in communication with a base of the at least one transistor to provide base-ballasting.

According to a number of embodiments, the disclosure relates to an amplifier die comprising an emitter-ballasted amplifier including at least one transistor formed over a silicon substrate, a metal pillar formed with respect to the silicon substrate such that a bottom of the metal pillar is in direct contact with the silicon substrate, and a first resistor in communication with an emitter of the at least one transistor and with the metal pillar, where heat generated during operation of the at least one transistor is transferred through the silicon substrate to the bottom of the metal pillar. The amplifier die further comprises an input pad electrically connected to a first terminal of the emitter-ballasted amplifier, an output pad electrically connected to a second terminal of the emitter-ballasted amplifier, and a plurality of interconnections configured to electrically connect at least the first resistor to the metal pillar. In an embodiment, a portable transceiver comprises the amplifier die.

Certain embodiments relate to a multi-chip module comprising a flip chip amplifier die including at least one emitter-ballasted amplifier configured to amplify an input signal and to generate an amplified output signal, where the at least one emitter-ballasted amplifier includes at least one transistor formed over a silicon substrate, a metal pillar formed with respect to the silicon substrate such that a bottom of the metal pillar is in direct contact with the silicon substrate, and a first resistor in communication with an emitter of the at least one transistor and with the metal pillar. Heat generated during operation of the at least one transistor is transferred through the silicon substrate to the bottom of the metal pillar. The multi-chip module further comprises an output matching network die including an output matching network circuit configured to match an impedance of a fundamental frequency of the amplified output signal. In an embodiment, the emitter-ballasted amplifier includes a SiGe power amplifier.

Advantages of embodiments disclosed herein include:

1. An efficient method to remove heat from a SiGe NPN power transistor array which results in equivalent or lower thermal resistance than emitter bumping, thereby improving power, gain, and linearity of the SiGe power amplifier.

2. Emitter ballasting instead of base ballasting for thermal stability and improved linearity of a SiGe power amplifier.

3. An efficient design of collector and base power combining networks. When emitter bumps are used, the collector and base of the transistor exit the array orthogonally to the emitter, which creates unequal phase distribution between the base and collector or equal phase with less optimum impedance transformation networks from additional routing.

4. A straightforward conversion from chip-on-board (COB) and/or through-silicon-via (TSV) to flip chip (FC) package design and vice versa due to fewer changes to matching network layout and the overall IC floor plan.

5. A low impedance substrate connection, which achieves optimum linearity, output power, and efficiency from the NPN transistor array.

6. Superior linearity and ruggedness due to the use of emitter ballasting, as base ballasting degrades amplifier performance due to the reduction in collector to emitter breakdown voltage (ruggedness), reduction in peak current (Vbe droop), and increased base band impedance which degrades linearity (memory effect).

7. Prevents thermal coupling between adjacent arrays. The emitter bump removes heat that would otherwise be transferred to adjacent transistor arrays. Removal of the heat reduces current mismatch conditions, limits the amount of current collapse, and reduces thermal run away of the transistor arrays, which increases the safe operating area, increases reliability, and increases linearity of the amplifier.

BRIEF DESCRIPTION OF THE DRAWINGS

FIG. 13 illustrates another embodiment of electrothermal design for emitter-ballasted amplifiers implemented in flip chip configuration, according to certain embodiments.

FIG. 14 illustrates another embodiment of electrothermal design for emitter-ballasted amplifiers implemented in flip chip configuration, according to certain embodiments.

DETAILED DESCRIPTION

Figure 1:
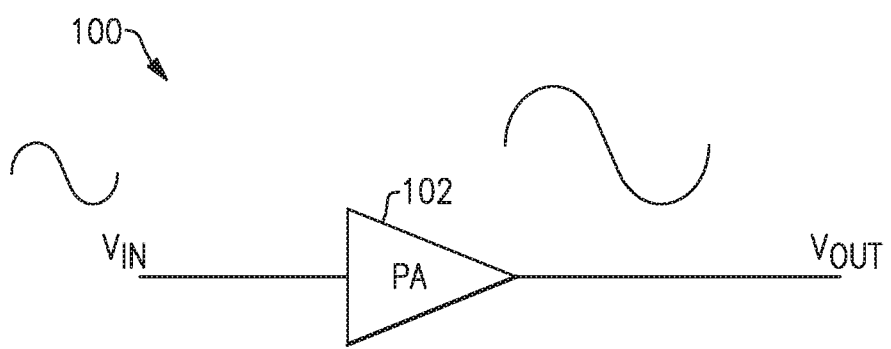
FIG. 1 illustrates an exemplary amplifying circuit, according to certain embodiments.

FIG. 1 is a schematic of an exemplary amplifying circuit 100 comprising an amplifier 102 that is configured to amplify an input signal Vin to provide an amplified output signal Vout. In an embodiment, the amplifier 102 comprises a power amplifier. In an embodiment, an output matching network receives the amplified output signal Vout and matches an impedance of a fundamental frequency of the amplified output signal. In an embodiment, a front end module comprises the amplifier 102 and the output matching network.

In the design of bipolar power amplifier devices, ballasting is employed to limit the amount of current in the device to maintain thermal stability and achieve good electrical performance. In an embodiment, ballasting resistors electrically couple to the individual NPN cells that make up a power transistor array. Either base or emitter ballasting can prevent thermal runaway and catastrophic failure of the NPN array.

Figure 2:
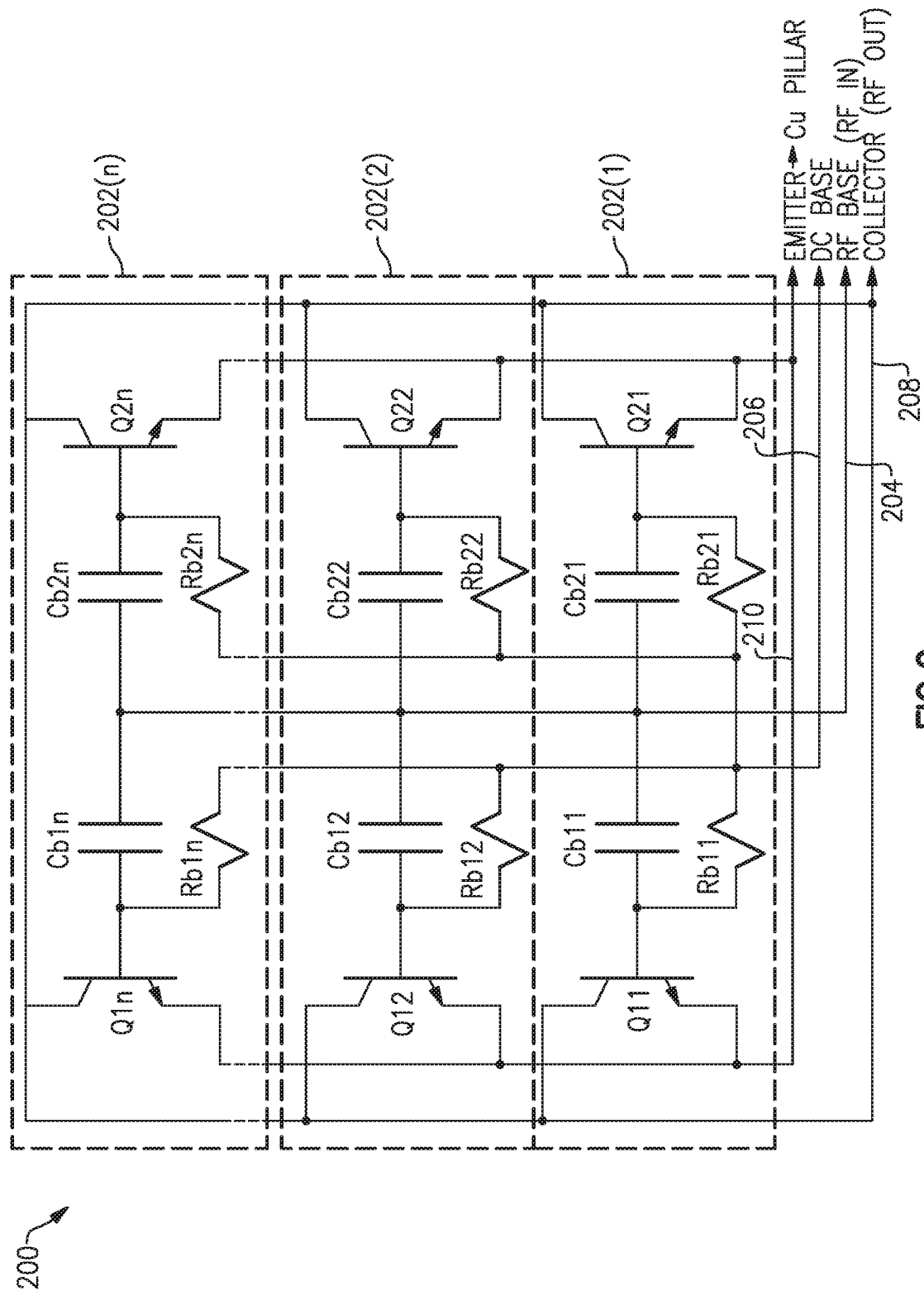
FIG. 2 is a schematic illustrating a base-ballasted amplifying circuit, according to certain embodiments.

FIG. 2 illustrates an embodiment of a base-ballasted amplifier 200 comprising an array of 1 to N base-ballasted transistor pairs 202(1)-202(n). In an embodiment, each base-ballasted transistor pair 202(n) comprises a first transistor Q1n, a second transistor Q2n, where each transistor Q1n, Q2n has a base, an emitter, and a collector. Each base-ballasted transistor pair 202(n) further comprises a first base resistor Rb1n, a second base resistor Rb2n, a first base capacitor Cb1n, and a second case capacitor Cb2n. In an embodiment, the amplifier 200 comprises a power amplifier. In a further embodiment, the amplifier 200 comprises a SiGe power amplifier.

For each base-ballasted transistor pair 202(n), a base terminal of the first transistor Q1n electrically couples to a first terminal of the first base resistor Rb1n and a first terminal of the first base capacitor Cb1n. And a base terminal of the second transistor Q2n electrically couples to a first terminal of the second base resistor Rb2n and a first terminal of the second base capacitor Cb2n.

Second terminals of the first base capacitors Cb11 through Cb1n electrically couple to second terminals of the second base capacitors Cb21 through Cb2n and to each other to form an amplifier base or an input 204 to the base-ballasted amplifier 200. In an embodiment, the input 204 comprises an RF input.

Second terminals of the first base resistors Rb11 through Rb1n electrically couple to second terminals of the second base resistors Rb21 through Rb2n and to each other and are in communication with a DC base signal 206. In an embodiment, the DC base signal 206 comprises a ground signal.

Collector terminals the first transistors Q11 through Q1n electrically couple to collector terminals of the second transistors Q21 through Q2n and to each other to form an amplifier collector or an output 208 from the base-ballasting amplifier 200. In an embodiment, the output 208 comprises an RF output.

Emitter terminals the first transistors Q11 through Q1n electrically couple to emitter terminals of the second transistors Q21 through Q2n and to each other to form an amplifier emitter 210 of the base-ballasting amplifier 200.

Figure 3:
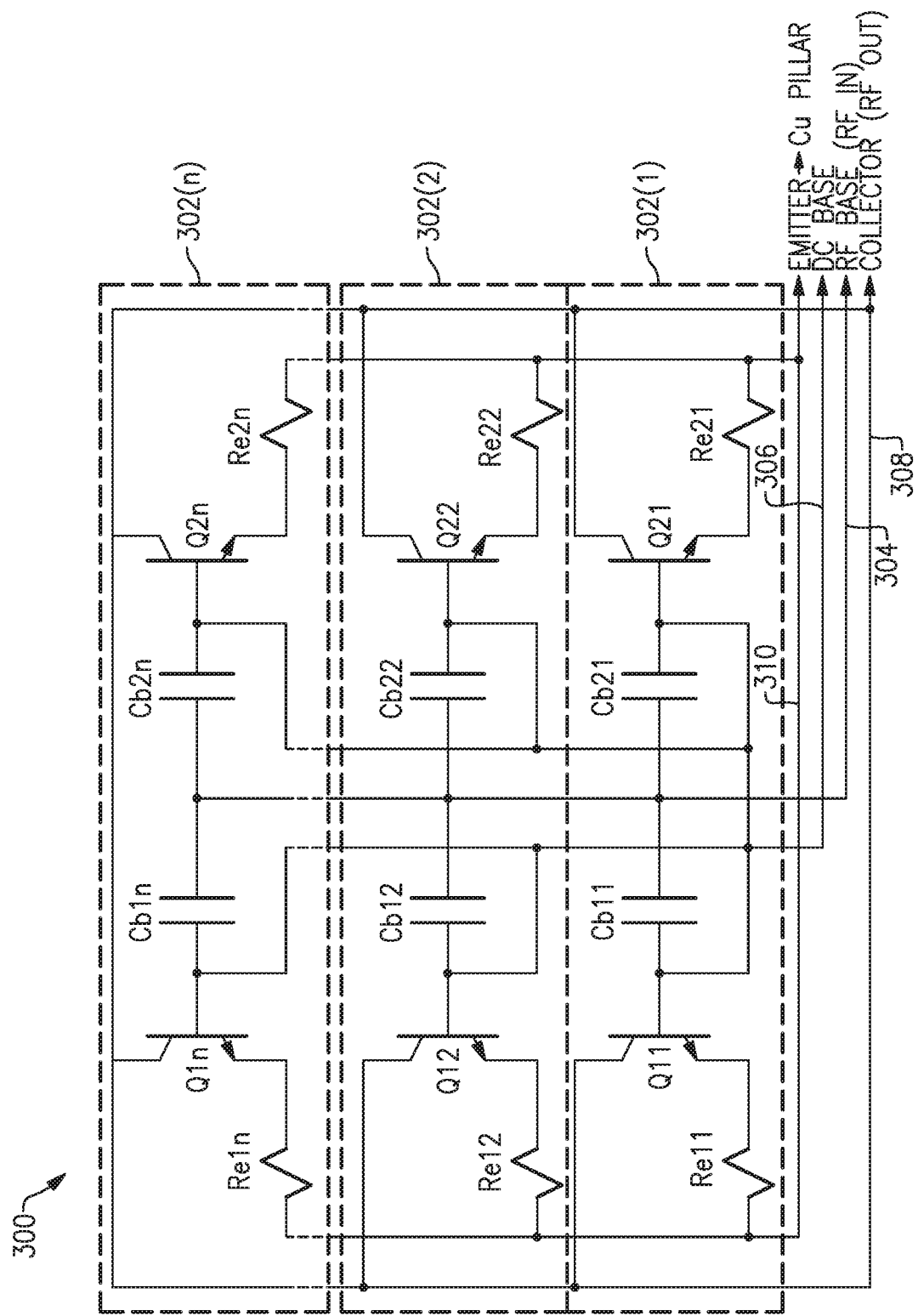
FIG. 3 is a schematic illustrating an emitter-ballasted amplifying circuit, according to certain embodiments.

FIG. 3 illustrates an embodiment of an emitter-ballasted amplifier 300 comprising an array of 1 to N emitter-ballasted transistor pairs 302(1)-302(n). In an embodiment, each emitter-ballasted transistor pair 302(n) comprises the first transistor Q1n, the second transistor Q2n, where each transistor Q1n, Q2n has a base, an emitter, and a collector. Each emitter-ballasted transistor pair 302(n) further comprises a first emitter resistor Re1n, a second emitter resistor Re2n, the first base capacitor Cb1n, and the second case capacitor Cb2n. In an embodiment, the amplifier 300 comprises a power amplifier. In a further embodiment, the amplifier 300 comprises a SiGe power amplifier.

For each emitter-ballasted transistor pair 302(n), the emitter terminal of the first transistor Q1n electrically couples to a first terminal of the first emitter resistor Re1n. And the emitter terminal of the second transistor Q2n electrically couples to a first terminal of the second emitter resistor Re2n. Second terminals of the first emitter resistors Re11 through Re1n electrically couple to second terminals of the second emitter resistors Re21 through Re2n and to each other to form an amplifier emitter 310 of the emitter-ballasted amplifier 300.

Base terminals of the first transistors Q11 through Q1n electrically couple to base terminals of the second transistors Q21 through Q2n, to first terminals of the first base capacitors Cb11 through Cb1n, and to first terminals of the second base capacitors Cb21 through Cb2n and are in communication with a DC base signal 306. In an embodiment, the DC base signal 306 comprises a ground signal.

Second terminals of the first base capacitors Cb11 through Cb1n electrically couple to second terminals of the second base capacitors Cb21 through Cb2n and to each other to form an amplifier base or an input 304 to the emitter-ballasted amplifier 300. In an embodiment, the input 304 comprises an RF input.

Collector terminals the first transistors Q11 through Q1n electrically couple to collector terminals of the second transistors Q21 through Q2n and to each other to form an amplifier collector or an output 308 from the emitter-ballasting amplifier 300. In an embodiment, the output 308 comprises an RF output.

For linear SiGe power amplifiers, emitter ballasting is typically preferred over base ballasting because base ballasting has many adverse effects on performance, such as but not limited to, lower breakdown voltage and poorer linearity. Emitter ballasting not only provides thermal stability but also achieves better electrical performance than base ballasting.

Flip chip, also known as controlled collapse chip connection or its acronym, C4, is a method for interconnecting semiconductor devices, such as integrated circuits or IC chips and microelectromechanical systems (MEMS), to external circuitry with solder bumps that have been deposited onto bump pads.

Figure 4:
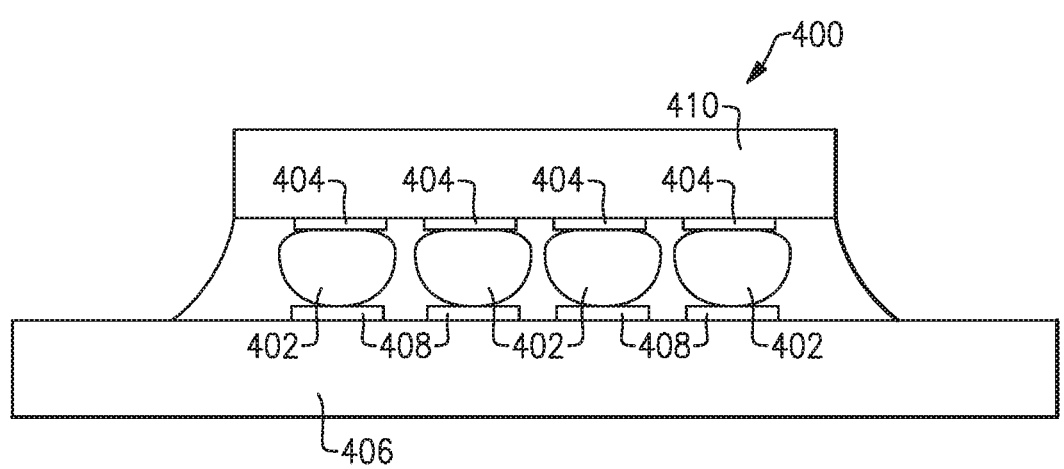
FIG. 4 illustrates an exemplary flip-chip interconnection of semiconductor devices, according to certain embodiments.

FIG. 4 illustrates an exemplary flip-chip assembly 400 comprising an integrated circuit (IC) 410. In an embodiment, the IC 410 comprises an amplifier, such as, but not limited to amplifier 200, 300. In another embodiment, the IC 410 comprises a power amplifier. In a further embodiment, the IC 410 comprises a SiGe power amplifier.

Copper (Cu) pillars or solder bumps 402 are deposited on Cu solder pads or bump pads 404 on the top side of the wafer associated with the IC 410 during the final wafer-processing step. In order to mount the IC 410 to external circuitry 406 (e.g., a circuit board or another chip or wafer), it is flipped over so that its top side faces down, and aligned so that its Cu solder pads 404 align with matching pads 408 on the external circuitry 406, and then the solder is reflowed to complete the interconnect. This is in contrast to wire bonding, in which an integrated circuit is mounted upright, and wires are used to interconnect chip pads to the external circuitry 406.

In power amplifier design, it is important to minimize the thermal resistance and limit the negative effects of excess heat on circuit performance parameters, such as but not limited to power, gain, and linearity. In flip-chip power-amplifier design, the amplifier emitters 210, 310 often connect directly to a copper (Cu) pillar pad associated with a Cu pillar, which provides heat sinking for heat dissipation.

Figure 5:
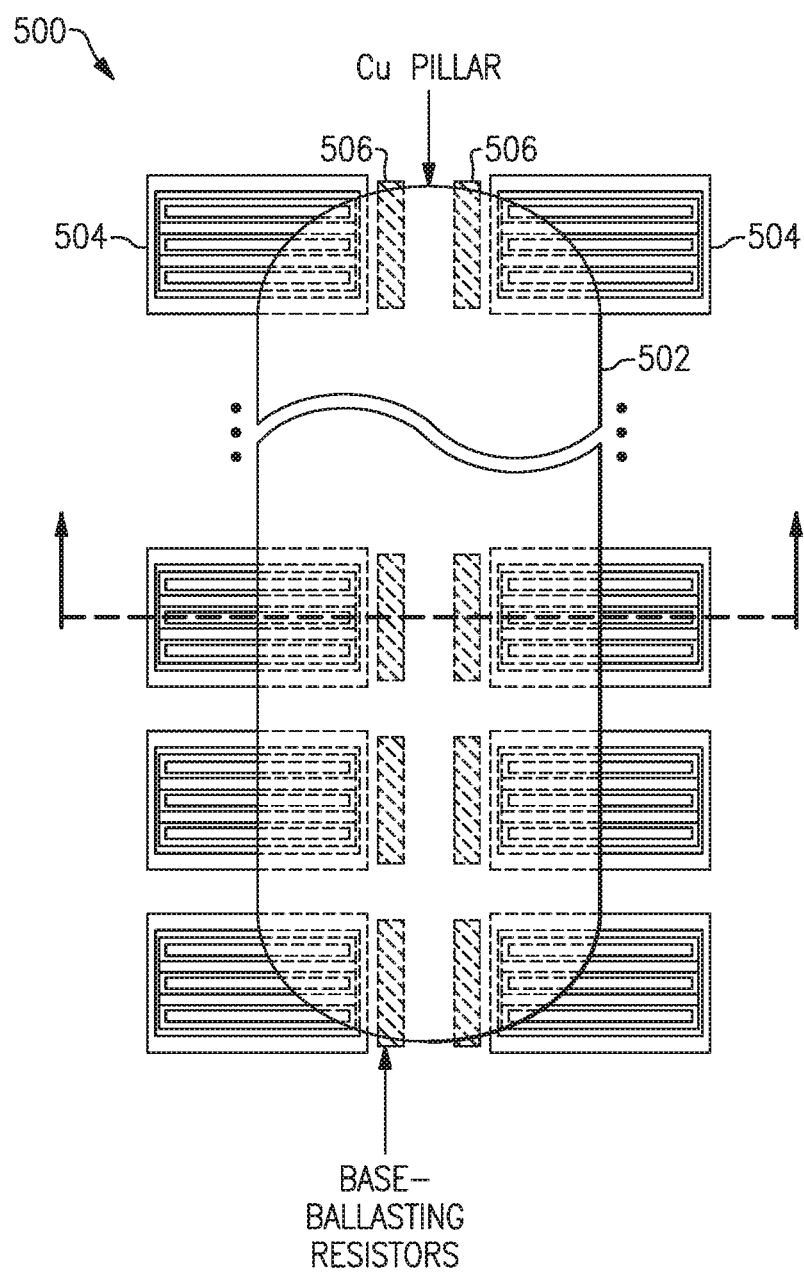
FIG. 5 illustrates a top view of an exemplary flip-chip amplifier layout for a base-ballasted amplifier, according to certain embodiments.

FIG. 5 illustrates a top view of an exemplary flip-chip amplifier layout for electrothermal management of a base-ballasted amplifier 500. A Cu pillar 502 sits over the amplifier 500, which comprises an array 504 of transistors Q11-Q1n, Q21-Q2n and a plurality of base-ballasting resistors 506.

Figure 6:
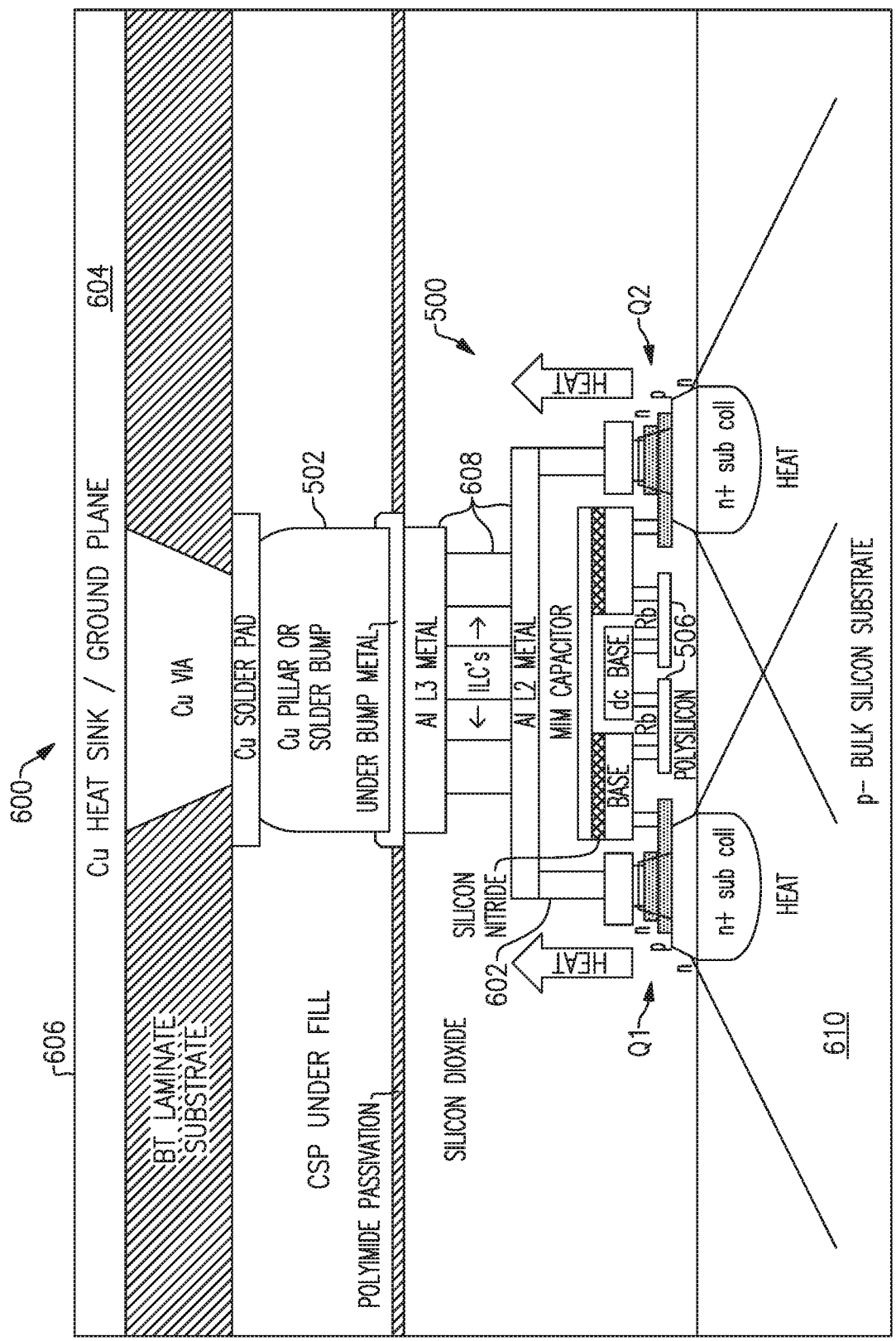
FIG. 6 illustrates a cross section of the base-ballasted amplifier of FIG. 5, according to certain embodiments.

FIG. 6 illustrates a cross section 600 of the base-ballasted amplifier 500 of FIG. 5. FIG. 6 shows base-ballasted transistors Q1, Q2 of the array 504 formed over a bulk silicon substrate 610. The base terminal of the transistor Q1, Q2 is in communication with the base-ballasting resistor 506. FIG. 6 further shows the emitter of the transistor Q1, Q2 in communication with an emitter-contact via 602. In an embodiment, the emitter-contact via 602 comprises a poly-silicon-emitter-contact via. Inter-level metals and contacts 608, in an embodiment, comprise L3 metal, inter-level contacts (ILC), and L2 metal, and are in communication with the emitter contact 602 and the Cu pillar 502. The Cu pillar 502, through a Cu solder pad, is in contact with a laminate interposer or printed circuit board 606. The laminate interposer or printed circuit board 606 comprises the Cu solder pad, a Cu via, and a Cu heat sink/ground plane 604.

Referring to FIGS. 5 and 6, in an embodiment, a solution for thermal management in flip-chip power-amplifier design comprises connecting the emitter-contact via 602 to the Cu pillar 502 using all metal levels and contact-via levels 608 available in the technology. The Cu pillar 502 then connects to the heat sink/ground 604 on the laminate interposer or printed circuit board 606. Heat is removed from the emitter through relatively small area polysilicon-emitter contact vias 602, which transition up through the inter-level metals and contacts 608 to the Cu pillar 502 and to the heat sink/ground plane 604. The emitter contact area is substantially less than that achieved with silicon bumping, which results in restricted heat flow.

For example, the Cu pillar 502, which can measure approximately 90 µm×180 µm, is transitioned and reduced down to the size of the polysilicon-emitter-contact via 602 which, in an embodiment, is approximately 25 µm×0.4 µm or less. In certain embodiments, there may be approximately 60 or more emitter contacts 602 made to a single Cu pillar 502. The area of the inter-level metals and contacts 608 is also constricted due to the presence of the collector terminals and the desire to make robust electrical contact to the collector terminals. This reduction in metal and contact area increases thermal resistance.

While emitter ballasting would improve electrical properties of the amplifier 500, applying emitter ballasting may be impractical to implement and it may lead to an excessive rise in the thermal resistance and junction temperature due to the discontinuity caused by the emitter-ballasting resistor in the heat transfer path. Thus, base ballasting is used to provide thermal stability since emitter ballasting is neither possible nor desirable without causing significant degradation in the thermal conductivity.

For at least these reasons, connecting the polysilicon emitter directly to the Cu pillar 502 and heat sink 604 with base ballasting, instead of the more electrically optimal emitter ballasting, has traditionally been the electrothermal solution for flip-chip power-amplifier design.

Embodiments of better electrothermal design for amplifiers implemented in flip chip configuration are disclosed herein. In an embodiment, the amplifiers comprise power amplifiers. In another embodiment, the amplifiers comprise SiGe power amplifiers.

Figure 7:
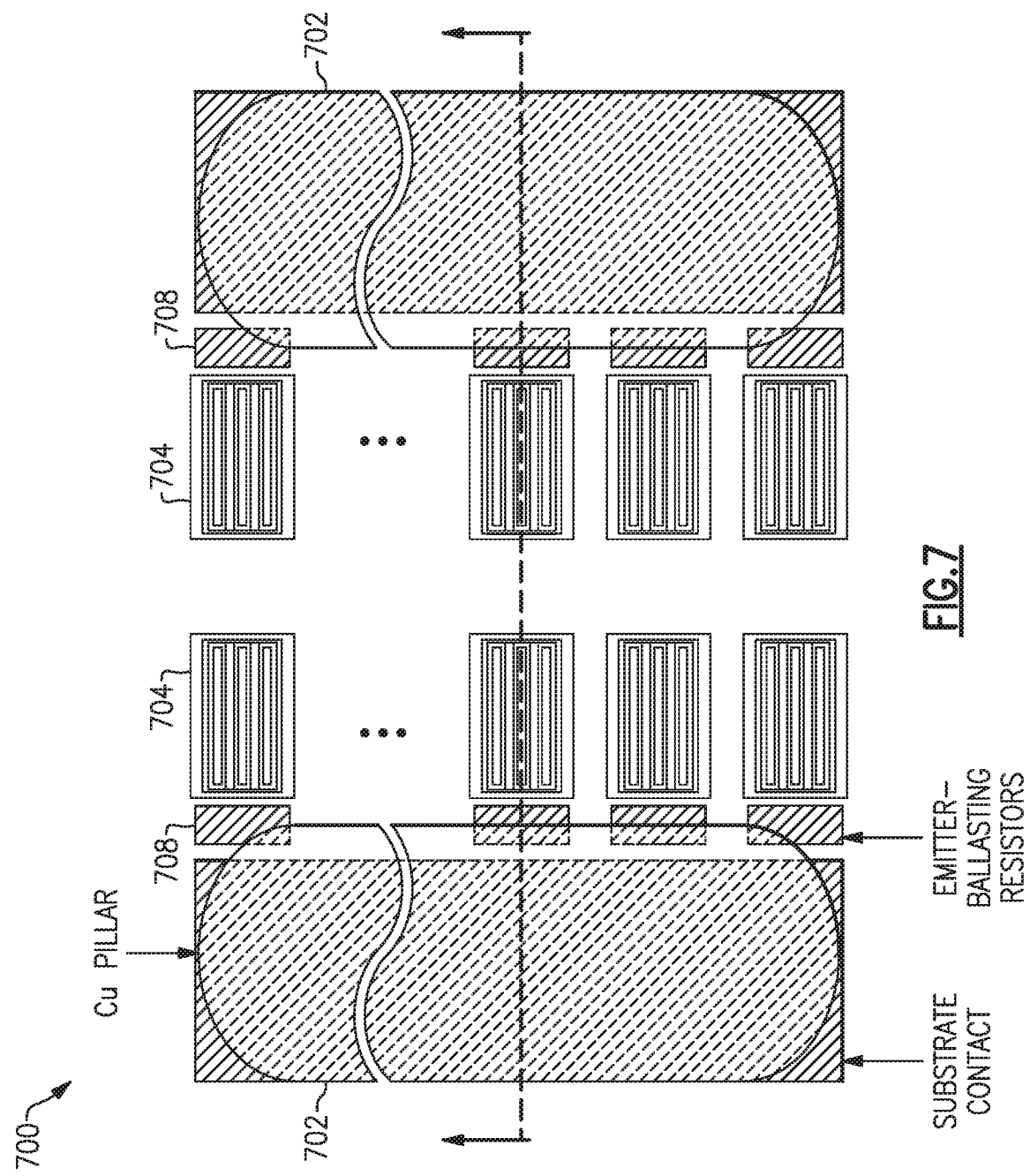
FIG. 7 illustrates a top view of an exemplary flip-chip amplifier layout for an emitter-ballasted amplifier, according to certain embodiments.

FIG. 7 illustrates a top view of an exemplary flip-chip amplifier layout for electrothermal management of an emitter-ballasted amplifier 700 that can be used for RF power generation. Amplifier 700 comprises an array 704 of transistors Q11-Q1$n$, Q21-Q2$n$ and a plurality of emitter-ballasting resistors 708.

Figure 8:
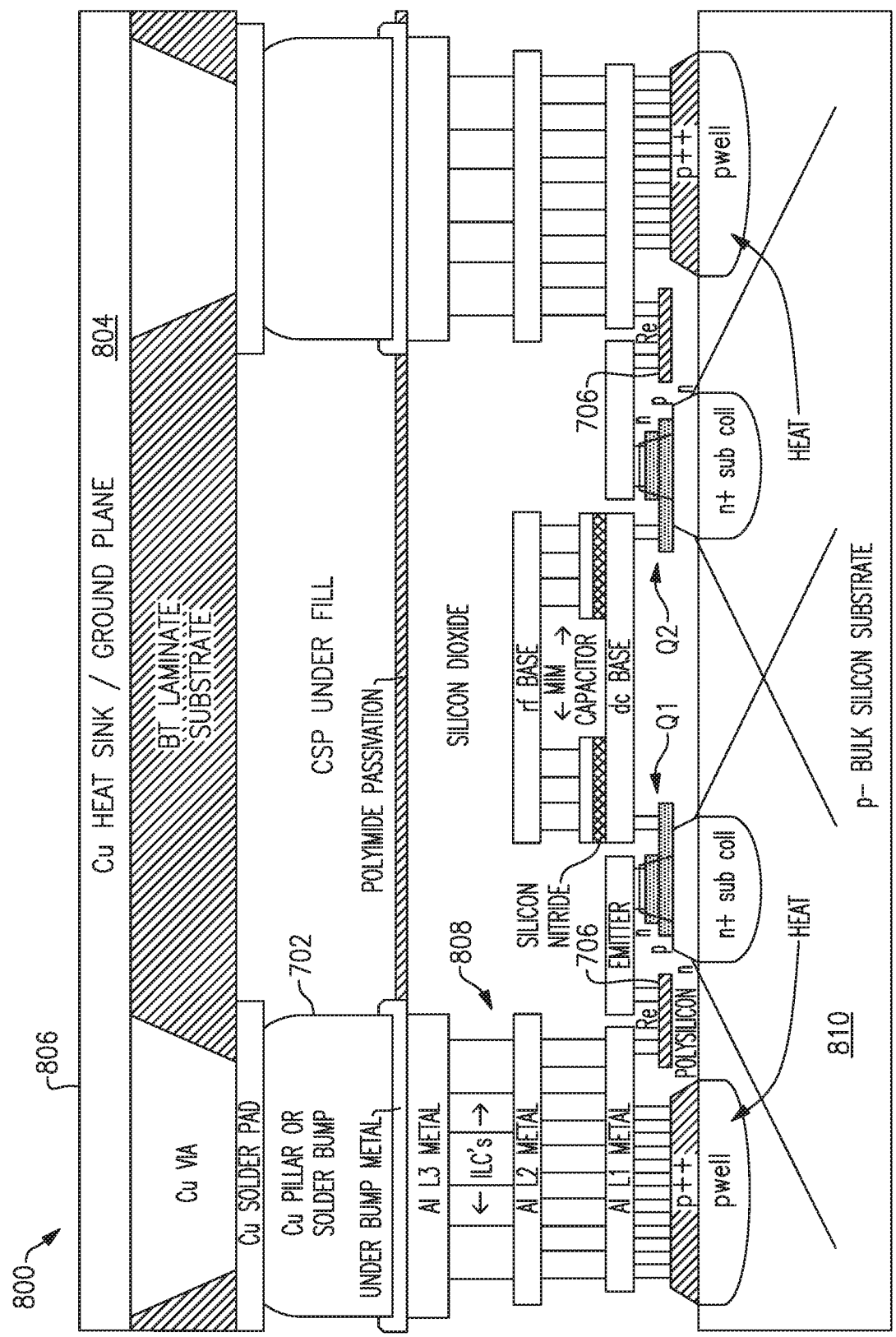
FIG. 8 illustrates a cross section of the emitter-ballasted amplifier of FIG. 7, according to certain embodiments.

FIG. 8 illustrates a cross section of the emitter-ballasted amplifier 700 of FIG. 7. FIG. 8 shows emitter-ballasted transistors Q1, Q2 of the array 704 formed over a bulk silicon substrate 810. The emitter terminal of the transistor Q1, Q2 is in communication with the emitter-ballasting resistor 706, which introduces a discontinuity in the heat transfer of the heat generated in the emitter to the Cu pillar 702. FIG. 8 further shows inter-level metals and contacts 808 in communication with the bulk silicon substrate 810 and the Cu pillar 702. In an embodiment, the inter-level metals and contacts 808 comprise L3 metal, inter-level contacts (ILC), L2 metal, and L1 metal. The Cu pillar 702, through a Cu solder pad, is in contact with the laminate interposer or printed circuit board 806. The laminate interposer or printed circuit board 806 comprises the Cu solder pad, a Cu via, and a Cu heat sink/ground plane 804.

Referring to FIGS. 7 and 8, in an embodiment, a solution for thermal management in flip-chip power-amplifier design comprises placing the metal bumps or Cu pillars 702 adjacent to the transistor arrays 704 and over inter-level metals and contacts 808. By placing the metal of the Cu pillar 702 and the inter-level metals and contacts 808 in intimate contact with the bulk silicon substrate 810, the heat generated by the transistor arrays 704 flows into the silicon substrate 810, through the inter-level metals and contacts 808, and then out the Cu pillar 702 which is in thermal contact with the heat sink/ground plane 804 of the laminate interposer or printed circuit board 806.

Thus, the thermal properties of the silicon substrate 810 spread the heat to the substrate contacts, such as the inter-level metals and contacts 808. The heat is then removed through the large area of the substrate contacts, to the Cu pillars 702 and then to the heat sink/ground plane 804.

The substrate contacts provided by the inter-level metals and contacts 808 and the Cu pillars 702 also limit mutual heating of adjacent transistor arrays 704, which improves many electrical characteristics, such as current uniformity, gain versus time characteristics, and the like, of the power amplifier 700.

In another embodiment, the metal bump or Cu pillar 702 forms an electrical ground connection to the ground plane 804, which in turn forms a grounding point through the inter-level metals and contacts 808. The Cu pillar 702 is in close proximity to the transistor array 704 and, the emitter-ballasting resistors 708 can be in communication with the grounding point. In an embodiment, the grounding point provides emitter degeneration inductance to maintain high gain over a temperature range. In an embodiment, the ground is located on the interposed or printed circuit board (PCB) 406.

Figure 9:
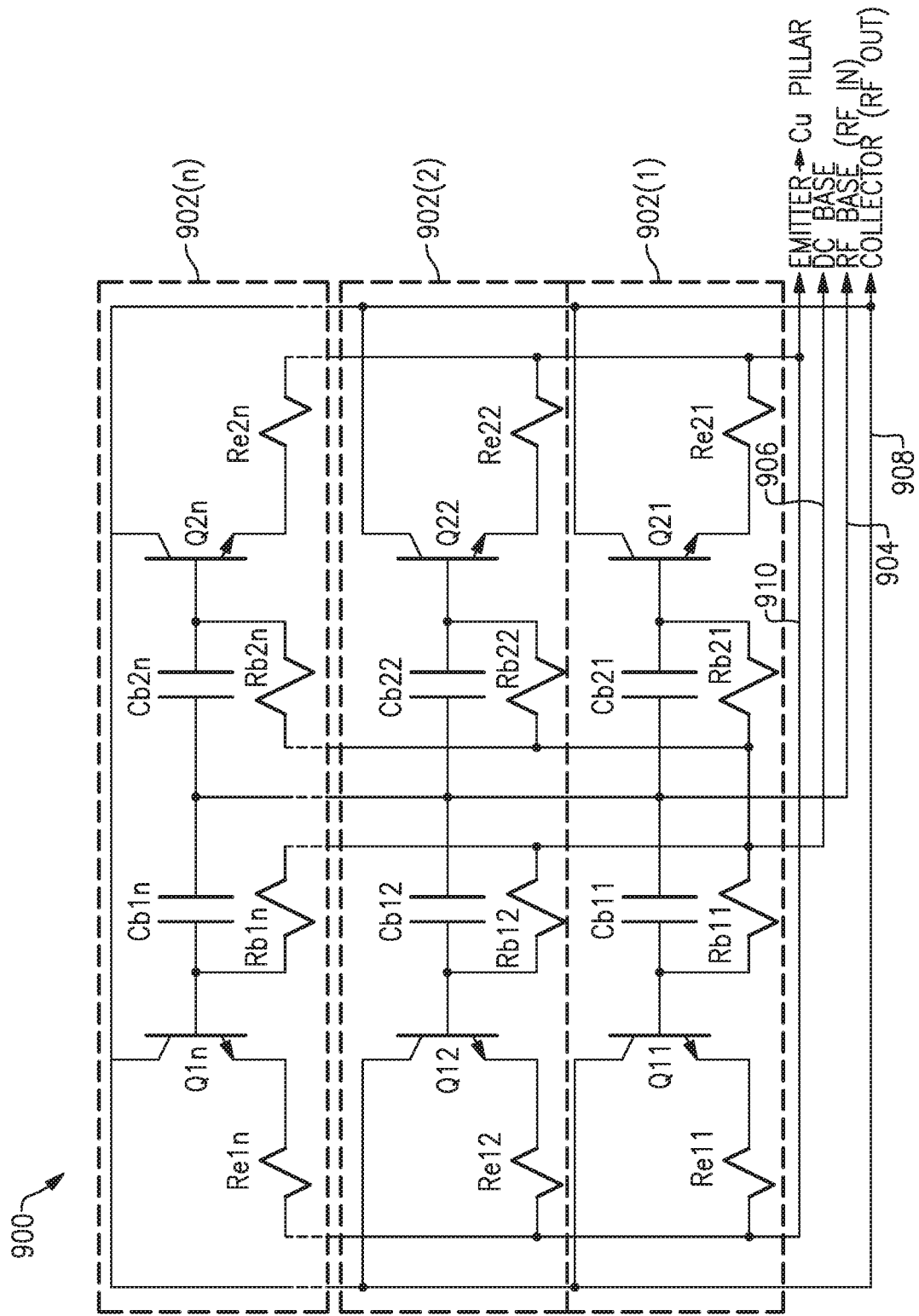
FIG. 9 is a schematic illustrating a base and emitter-ballasted amplifying circuit, according to certain embodiments.

FIG. 9 illustrates an embodiment of a base and emitter-ballasted amplifier 900 comprising an array of 1 to N base and emitter-ballasted transistor pairs 902(1)-902($n$). In an embodiment, each base and emitter-ballasted transistor pair 902($n$) comprises a first transistor Q1$n$, a second transistor Q2$n$, where each transistor Q1$n$, Q2$n$ has a base, an emitter, and a collector. Each base and emitter-ballasted transistor pair 902($n$) further comprises the first base resistor Rb1$n$, the second base resistor Rb2$n$, the first base capacitor Cb1$n$, the second case capacitor Cb2$n$, the first emitter resistor Re1$n$, and the second emitter resistor Re2$n$. In an embodiment, the amplifier 900 comprises a power amplifier. In a further embodiment, the amplifier 900 comprises a SiGe power amplifier.

For each base and emitter-ballasted transistor pair 902($n$), the base terminal of the first transistor Q1$n$ electrically couples to the first terminal of the first base resistor Rb1$n$ and the first terminal of the first base capacitor Cb1$n$. And the base terminal of the second transistor Q2$n$ electrically couples to the first terminal of the second base resistor Rb2$n$ and the first terminal of the second base capacitor Cb2$n$.

Second terminals of the first base capacitors Cb11 through Cb1$n$ electrically couple to second terminals of the second base capacitors Cb21 through Cb2n and to each other to form an amplifier base or an input 904 to the base and emitter-ballasted amplifier 900. In an embodiment, the input 904 comprises an RF input.

Second terminals of the first base resistors Rb11 through Rb1n electrically couple to second terminals of the second base resistors Rb21 through Rb2n and to each other and are in communication with a DC base signal 906. In an embodiment, the DC base signal 906 comprises a ground signal.

For each base and emitter-ballasted transistor pair 902(n), the emitter terminal of the first transistor Q1n electrically couples to the first terminal of the first emitter resistor Re1n. And the emitter terminal of the second transistor Q2n electrically couples to the first terminal of the second emitter resistor Re2n. Second terminals of the first emitter resistors Re11 through Re1n electrically couple to second terminals of the second emitter resistors Re21 through Re2n and to each other to form an amplifier emitter 910 of the base and emitter-ballasted amplifier 900.

Collector terminals of the first transistors Q11 through Q1n electrically couple to collector terminals of the second transistors Q21 through Q2n and to each other to form an amplifier collector or an output 908 from the base and emitter-ballasting amplifier 900. In an embodiment, the output 908 comprises an RF output.

In an embodiment, the base-ballasting resistor provides base resistance for the base and emitter-ballasted amplifier 900. The base resistance provides RF isolation and assists with low frequency stability for the amplifier 900 under mismatched termination conditions.

Figure 10:
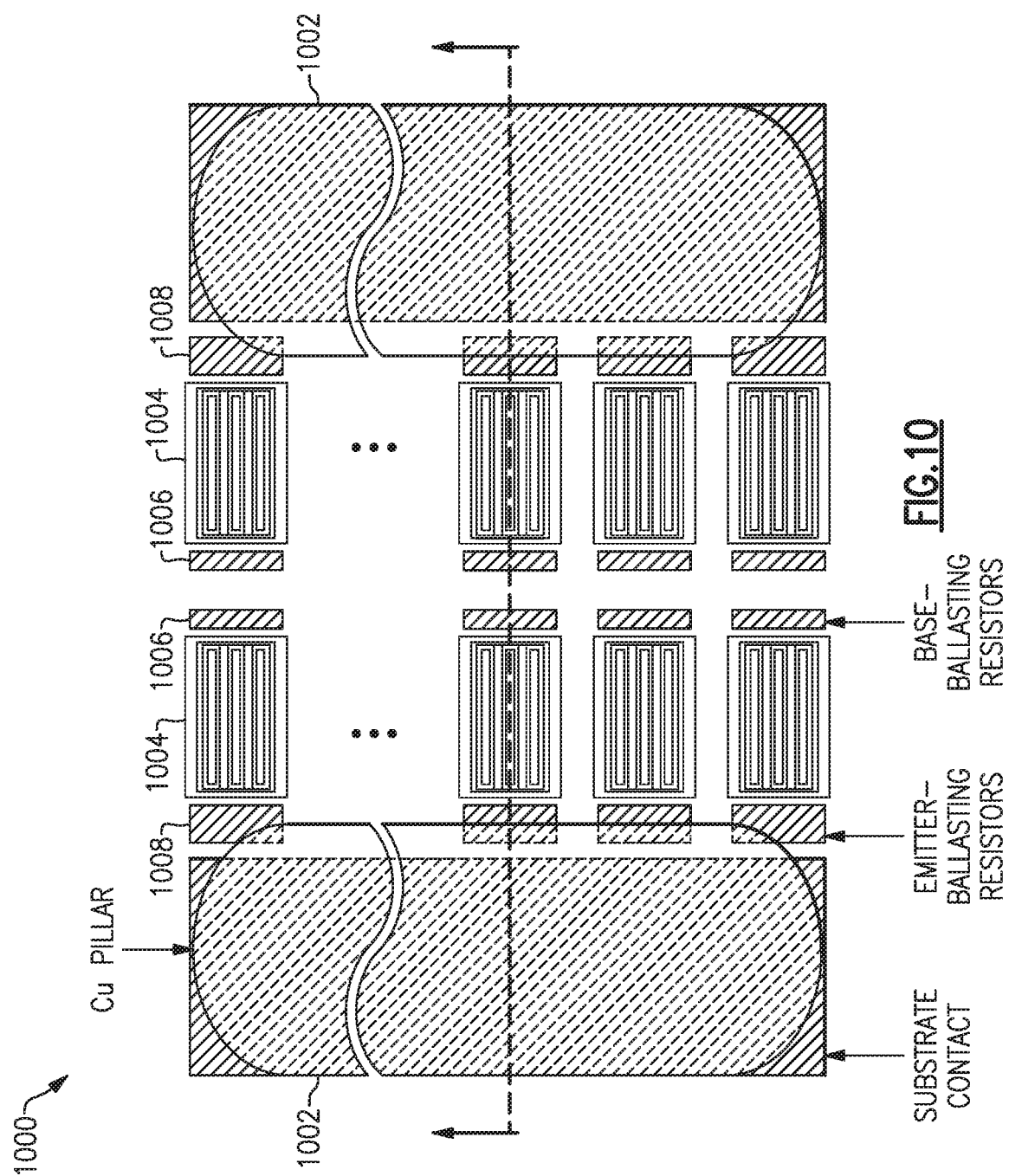
FIG. 10 illustrates a top view of an exemplary flip-chip amplifier layout for a base and emitter-ballasted amplifier, according to certain embodiments.

FIG. 10 illustrates a top view of an exemplary flip-chip amplifier layout for electrothermal management of a base and emitter-ballasted amplifier 1000. Amplifier 1000 comprises an array 1004 of transistors Q11-Q1n, Q21-Q2n, a plurality of base-ballasting resistors 1006, and a plurality of emitter-ballasting resistors 1008.

Figure 11:
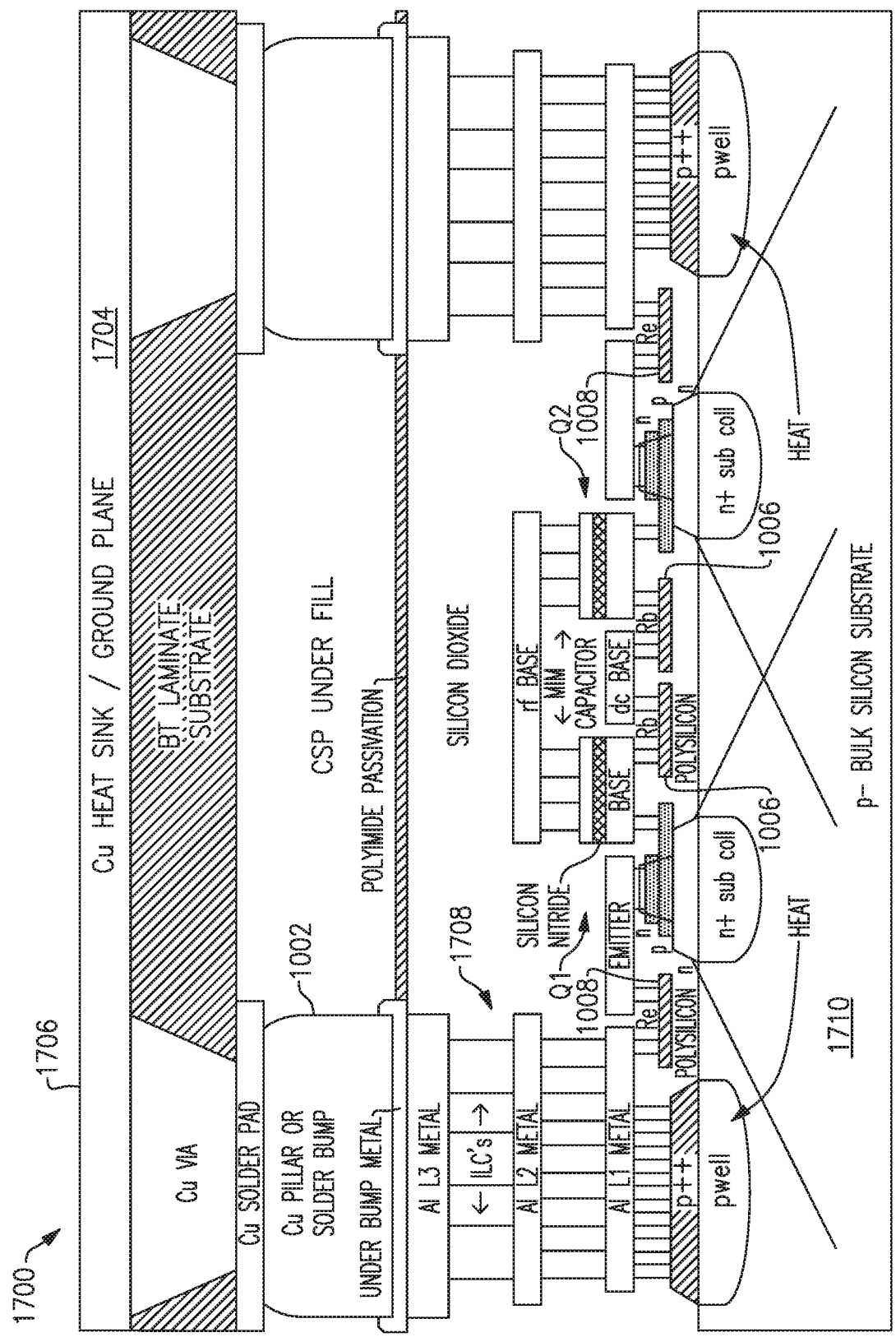
FIG. 11 illustrates a cross section of the base and emitter-ballasted amplifier of FIG. 10, according to certain embodiments.

FIG. 11 illustrates a cross section 1700 of the base and emitter-ballasted amplifier 1000 of FIG. 10. FIG. 11 shows base and emitter-ballasted transistors Q1, Q2 of the array 1004 formed over a bulk silicon substrate 1710. The base terminal of the transistor Q1, Q2 is in communication with the base-ballasting resistor 1006. The emitter terminal of the transistor Q1, Q2 is in communication with the emitter-ballasting resistor 1008, which introduces a discontinuity in the heat transfer of the heat generated in the emitter to the Cu pillar 1002. FIG. 11 further shows inter-level metals and contacts 1708 in communication with the bulk silicon substrate 1710 and the Cu pillar 1002. In an embodiment, the inter-level metals and contacts 1708 comprise L3 metal, inter-level contacts (ILC), L2 metal, and L1 metal. The Cu pillar 1002, through a Cu solder pad, is in contact with a laminate interposer or printed circuit board 1706. The laminate interposer or printed circuit board 1706 comprises the Cu solder pad, a Cu via, and a Cu heat sink/ground plane 1704.

Referring to FIGS. 10 and 11, in an embodiment, a solution for thermal management in flip-chip power-amplifier design comprises placing metal bumps or Cu pillars 1002 adjacent to the transistor arrays 1004 and over inter-level metals and contacts 1708. By placing the metal of the Cu pillar 1002 and the inter-level metals and contacts 1708 in intimate contact with a silicon substrate 1710, the heat generated by the transistor arrays 1004 flows into the silicon substrate 1710, through the inter-level metals and contacts 1708, and then out the Cu pillar 1002 which is in thermal contact with the heat sink/ground plane 1704 of the laminate interposer or printed circuit board 1706.

Thus, as described above, the thermal properties of the silicon substrate 1710 spread the heat to the substrate contacts, such as the inter-level metals and contacts 1708. The heat is then removed through the large area of the substrate contacts, to the Cu pillars 1002 and the heat sink/ground plane 1704.

In another embodiment, the metal bump or Cu pillar 1002 forms an electrical ground connection to the ground plane 1704, which in turn forms a grounding point through the inter-level metals and contacts 1708. The Cu pillar 1002 is in close proximity to the transistor array 1004 and, the emitter-ballasting resistors 1008 can be in communication with the grounding point.

Figure 12:
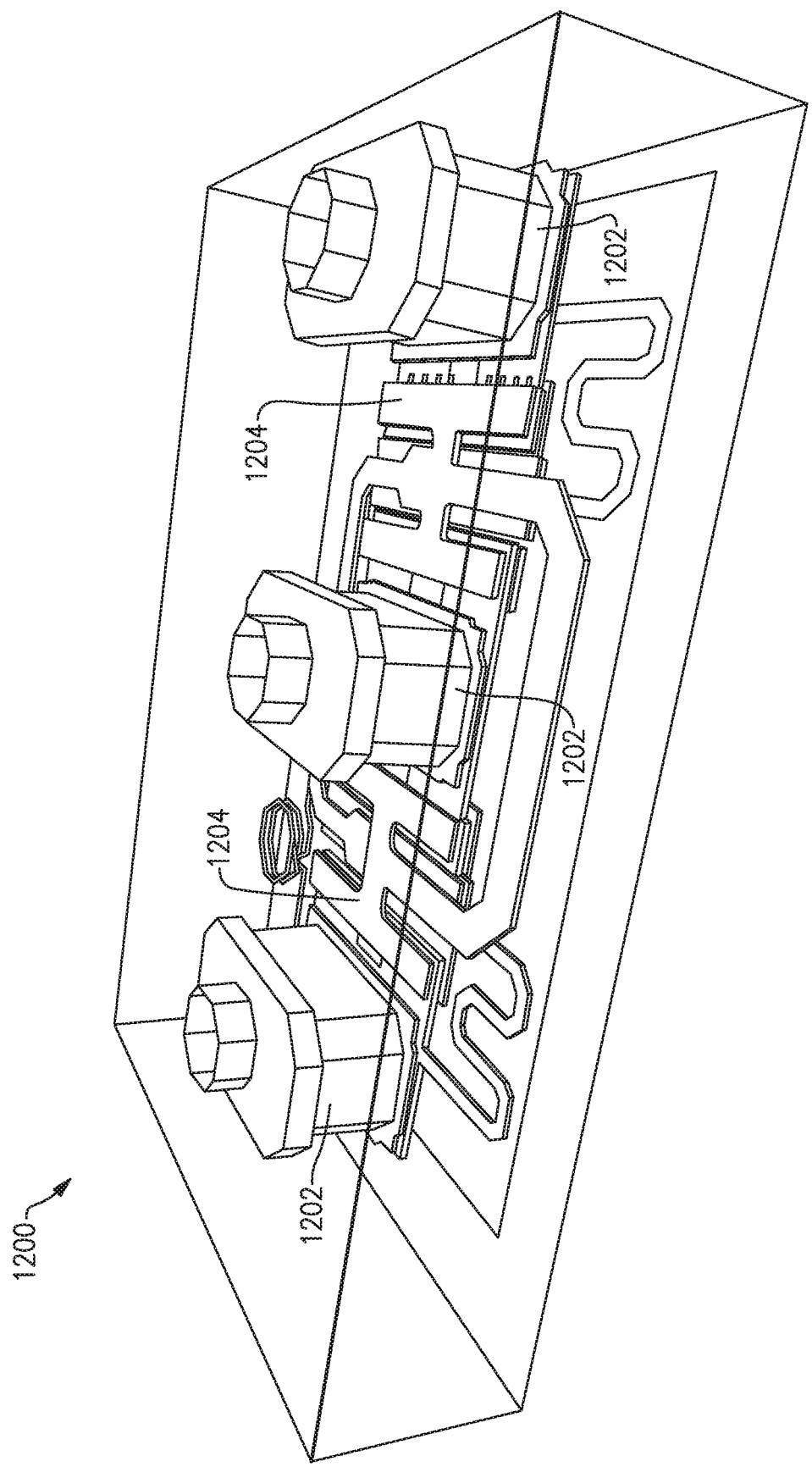
FIG. 12 illustrates a perspective view of an exemplary amplifier layout showing Cu pillars beside transistors arrays, according to certain embodiments.

FIG. 12 illustrates a perspective view of an exemplary flip chip layout of an amplifier 1200 showing at least Cu pillars 1202 beside transistors arrays 1204. In an embodiment, the amplifier 1200 comprises at least one of a power amplifier, a SiGe power amplifier, an emitter-ballasted amplifier, a base and emitter-ballasted amplifier, and a base-ballasted amplifier. FIG. 12 further illustrates the current uniformity benefits of the design. The three copper pillars 1202 are arranged with two transistor arrays 1204 between the left copper pillar 1202 and the middle copper pill 1202 and with another two transistor arrays 1204 between the middle copper pillar 1202 and the right copper pillar 1202. The middle pillar 1202 provides thermal sharing of the heat generated by the transistor arrays 1204 on both sides of it. The thermal sharing promotes uniform current density between all of the transistor arrays 1204. When the currents are uniform, the amplifier 1200 exhibits more linear performance than when the currents are not uniform.

FIGS. 13 and 14 illustrates additional embodiments of electrothermal design for emitter-ballasted amplifiers implemented in flip chip configuration.

FIG. 13 illustrates an amplifier layout of an amplifier 1300 comprising NPN arrays 1304, a bump or Cu pillar 1302, and an emitter-ballasting resistor 1308 in communication with an emitter 1312 and the Cu pillar 1302. The Cu pillar 1302 sets directly on an active silicon region 1310 and adjacent to the NPN arrays 1304 to provide a more efficient thermal path than when the back-end-of-line (BEOL) stack of metals and dielectrics are underneath the Cu pillar 1302. The BEOL stack is not as thermally conductive as the solid metal forming the bump or Cu pillar 1302. By removing the BEOL stack from underneath the Cu pillar 1302, the layout embodiment illustrated in FIG. 13 provides less thermal resistance to the thermal path than when the BEOL stack is positioned underneath the Cu pillar 1302.

FIG. 14 illustrates an amplifier layout of an amplifier 1400 comprising NPN arrays 1404, a bump or Cu pillar 1402, and an emitter-ballasting resistor 1408 in communication with an emitter 1412 and the Cu pillar 1402. In this layout embodiment, the Cu pillar 1402 is sunk into a silicon active region 1410 and is adjacent to the NPN arrays 1404. In an embodiment, a cavity is etched into the plane of the wafer. The metal bump or Cu pillar 1402 is formed within the cavity and protrudes outwards and upwards to provide additional thermal paths along the sides of the Cu pillar 1402 for waste heat.

Figure 15:
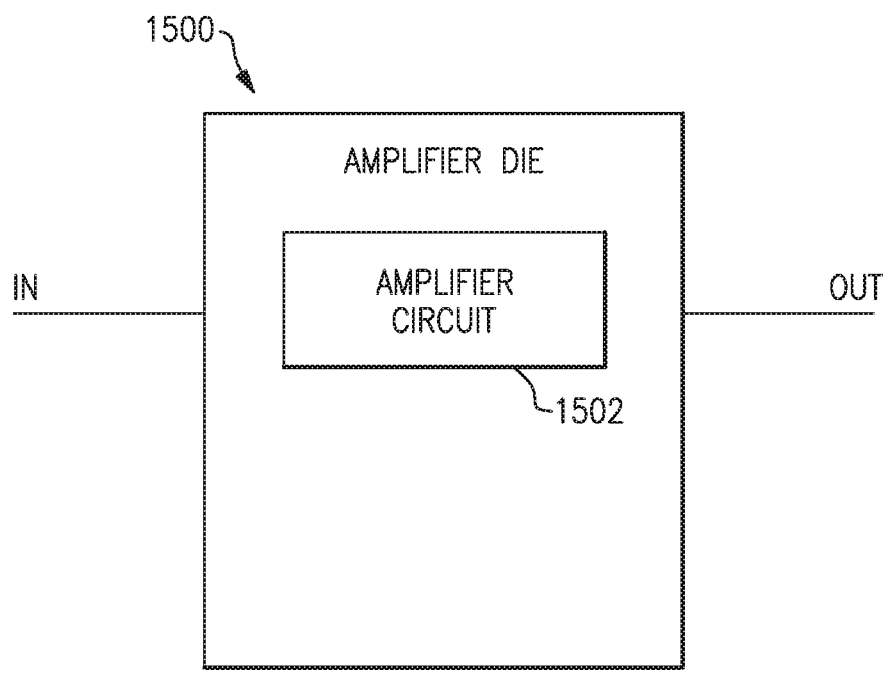
FIG. 15 is an exemplary block diagram of an amplifier die, according to certain embodiments.

FIG. 15 illustrates an exemplary block diagram of an amplifier die 1500 including an embodiment of an amplifier 1502. In an embodiment, the amplifier 1502 comprises the amplifier circuit or amplifier layout 102, 200, 300, 500, 600, 700, 800, 900, 1000, 1200, 1300, 1400, 1700.

Figure 16:
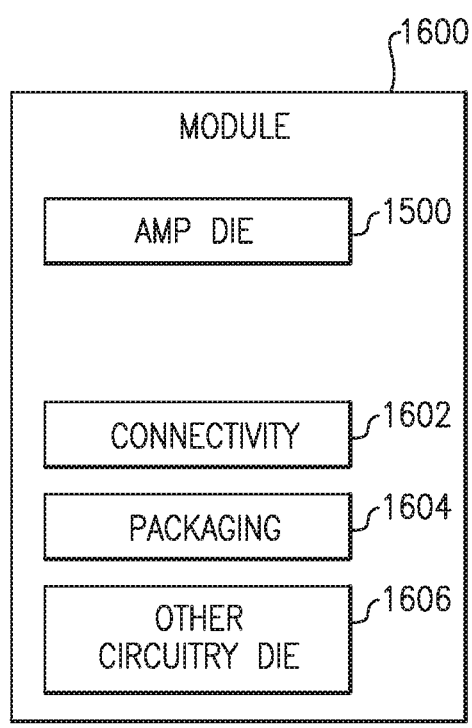
FIG. 16 is an exemplary block diagram of an amplifier module, according to certain embodiments.

FIG. 16 illustrates an exemplary block diagram of a module 1600 including amplifier die 1500 of FIG. 15. The module 1600 further includes connectivity 1602 to provide signal interconnections, packaging 1604, such as for example, a package substrate, for packaging of the circuitry, and other circuitry die 1606, such as, for example amplifiers, pre-filters, post filters modulators, demodulators, down converters, and the like, as would be known to one of skill in the art of semiconductor fabrication in view of the disclosure herein. In an embodiment, the module 1600 comprises a front-end module.

Figure 17:
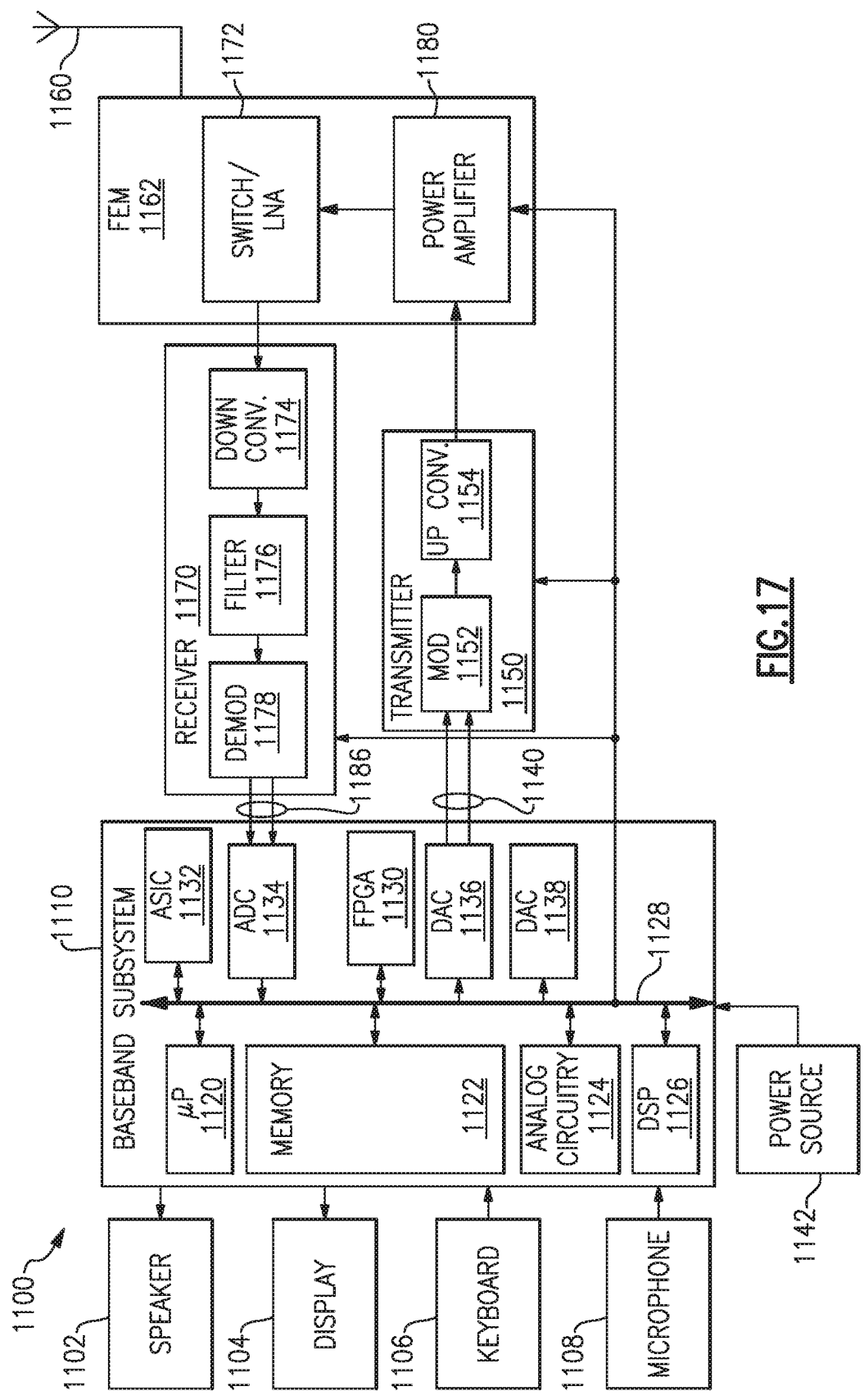
FIG. 17 is an exemplary block diagram illustrating a simplified portable transceiver including embodiments of flip-chip power amplifier layouts, according to certain embodiments.

FIG. 17 illustrates an exemplary block diagram illustrating a simplified portable transceiver 1100 including an embodiment of the amplifier 102, 200, 300, 500, 600, 700, 800, 900, 1000, 1200, 1300, 1400, 1500, 1600, 1700.

The portable transceiver 1100 includes a speaker 1102, a display 1104, a keyboard 1106, and a microphone 1108, all connected to a baseband subsystem 1110. A power source 1142, which may be a direct current (DC) battery or other power source, is also connected to the baseband subsystem 1110 to provide power to the portable transceiver 1100. In a particular embodiment, portable transceiver 1100 can be, for example but not limited to, a portable telecommunication device such as a mobile cellular-type telephone. The speaker 1102 and the display 1104 receive signals from baseband subsystem 1110, as known to those skilled in the art. Similarly, the keyboard 1106 and the microphone 1108 supply signals to the baseband subsystem 1110.

The baseband subsystem 1110 includes a microprocessor (µP) 1120, memory 1122, analog circuitry 1124, and a digital signal processor (DSP) 1126 in communication via bus 1128. Bus 1128, although shown as a single bus, may be implemented using multiple busses connected as necessary among the subsystems within the baseband subsystem 1110. The baseband subsystem 1110 may also include one or more of an application specific integrated circuit (ASIC) 1132 and a field programmable gate array (FPGA) 1130.

The microprocessor 1120 and memory 1122 provide the signal timing, processing, and storage functions for portable transceiver 1100. The analog circuitry 1124 provides the analog processing functions for the signals within baseband subsystem 1110. The baseband subsystem 1110 provides control signals to a transmitter 1150, a receiver 1170, and a power amplifier 1180, for example.

It should be noted that, for simplicity, only the basic components of the portable transceiver 1100 are illustrated herein. The control signals provided by the baseband subsystem 1110 control the various components within the portable transceiver 1100. Further, the function of the transmitter 1150 and the receiver 1170 may be integrated into a transceiver.

The baseband subsystem 1110 also includes an analog-to-digital converter (ADC) 1134 and digital-to-analog converters (DACs) 1136 and 1138. In this example, the DAC 1136 generates in-phase (I) and quadrature-phase (Q) signals 1140 that are applied to a modulator 1152. The ADC 1134, the DAC 1136, and the DAC 1138 also communicate with the microprocessor 1120, the memory 1122, the analog circuitry 1124, and the DSP 1126 via bus 1128. The DAC 1136 converts the digital communication information within baseband subsystem 1110 into an analog signal for transmission to the modulator 1152 via connection 1140. Connection 1140, while shown as two directed arrows, includes the information that is to be transmitted by the transmitter 1150 after conversion from the digital domain to the analog domain.

The transmitter 1150 includes the modulator 1152, which modulates the analog information on connection 1140 and provides a modulated signal to upconverter 1154. The upconverter 1154 transforms the modulated signal to an appropriate transmit frequency and provides the upconverted signal to the power amplifier 1180. The power amplifier 1180 amplifies the signal to an appropriate power level for the system in which the portable transceiver 1100 is designed to operate. In an embodiment, the power amplifier 1180 comprises the amplifier module 1600.

Details of the modulator 1152 and the upconverter 1154 have been omitted, as they will be understood by those skilled in the art. For example, the data on connection 1140 is generally formatted by the baseband subsystem 1110 into in-phase (I) and quadrature (Q) components. The I and Q components may take different forms and be formatted differently depending upon the communication standard being employed.

A front-end module 1162 comprises the power amplifier (PA) circuit 1180 and a switch/low noise amplifier (LNA) circuit 1172. In an embodiment, the switch/low noise amplifier circuit 1172 comprises an antenna system interface that may include, for example, a diplexer having a filter pair that allows simultaneous passage of both transmit signals and receive signals, as known to those having ordinary skill in the art.

In an embodiment, the front-end module 1162 comprises the module 1600. In an embodiment, the amplifier circuit comprises the amplifier 102, 200, 300, 500, 600, 700, 800, 900, 1000, 1200, 1300, 1400, 1700.

The power amplifier 1180 supplies the amplified transmit signal to the switch/low noise amplifier circuit 1172. The transmit signal is supplied from the front-end module 1162 to the antenna 1160 when the switch is in the transmit mode.

A signal received by antenna 1160 will be directed from the switch/low noise amplifier 1172 of the front-end module 1162 to the receiver 1170 when the switch is in the receive mode. The low noise amplifier circuitry 1172 amplifies the received signal.

If implemented using a direct conversion receiver (DCR), the downconverter 1174 converts the amplified received signal from an RF level to a baseband level (DC), or a near-baseband level (approximately 100 kHz). Alternatively, the amplified received RF signal may be downconverted to an intermediate frequency (IF) signal, depending on the application. The downconverted signal is sent to the filter 1176. The filter 1176 comprises a least one filter stage to filter the received downconverted signal as known in the art.

The filtered signal is sent from the filter 1176 to the demodulator 1178. The demodulator 1178 recovers the transmitted analog information and supplies a signal representing this information via connection 1186 to the ADC 1134. The ADC 1134 converts these analog signals to a digital signal at baseband frequency and transfers the signal via bus 1128 to the DSP 1126 for further processing.

The methods and apparatus described herein provide amplifier designs for electrothermal management. In embodiments of the amplifier 102, 200, 300, 700, 800, 900, 1000, 1180, 1200, 1300, 1400, 1500, 1600, 1700, the transistors Q1, Q2, Q11-Q1$n$, Q21-Q2$n$ comprise NPN bipolar junction transistors (BJTs). The amplifiers 102, 200, 300, 500, 600, 700, 800, 900, 1000, 1180, 1200, 1300, 1400, 1500, 1600, 1700 can also be implemented using different technologies, such as, but not limited to SiGe, MOS, PNP BJT, HBT, pHEMT, GaN, Gas, InGaP Gas HBT, MOSFET, SOI, Bulk CMOS, CMOS, and the like.

Terminology

Some of the embodiments described above have provided examples in connection with mobile phones. However, the principles and advantages of the embodiments can be used for any other systems or apparatus that have needs for power amplifier systems.

Such a system or apparatus can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone such as a smart phone, a telephone, a television, a computer monitor, a computer, a hand-held computer, a laptop computer, a tablet computer, a personal digital assistant (PDA), a PC card, a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods, apparatus, and systems described herein may be embodied in a variety of other forms; furthermore, various omissions, substitutions, and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A device comprising:
an amplifier including at least one transistor formed over a silicon substrate;
a metal pillar formed with respect to the silicon substrate such that a portion of the metal pillar is in direct contact with the silicon substrate, heat generated during operation of the at least one transistor being transferred through the silicon substrate to the portion of the metal pillar, wherein the metal pillar protrudes outward and upward from the cavity; and
a first resistor in communication with an emitter of the at least one transistor and with the metal pillar.

2. The device of claim 1 further comprising a second resistor in communication with a base of the at least one transistor.

3. The device of claim 1 wherein the metal pillar is formed within a cavity etched into the silicon substrate.

4. The device of claim 3 wherein the metal pillar protrudes outward and upward from the cavity.

5. The device of claim 1 wherein the portion of the metal pillar in direct contact with the silicon substrate is a bottom and at least a portion of sides of the metal pillar.

6. The device of claim 1 wherein the portion of the metal pillar in direct contact with the silicon substrate is a bottom of the metal pillar.

7. The device of claim 1 wherein the metal pillar is configured to provide a flip chip interconnection for the amplifier.

8. The device of claim 1 wherein the metal pillar is adjacent to the at least one transistor.

9. A method to implement an emitter-ballasted amplifier in a flip chip configuration, the method comprising:
forming an amplifier including at least one transistor over a silicon substrate;
etching a cavity into the silicon substrate; and
forming a metal pillar within the cavity such that a portion of the metal pillar is in direct contact with the silicon substrate and such that the metal pillar protrudes outward and upward from the cavity, heat generated during operation of the at least one transistor being transferred through the silicon substrate to the portion of the metal pillar.

10. The method of claim 9 further comprising forming a first resistor in electrical communication with an emitter of the at least one transistor and with the metal pillar.

11. The method of claim 9 wherein the portion of the metal pillar in direct contact with the silicon substrate is a bottom and at least a portion of sides of the metal pillar.

12. A wireless mobile device comprising:
an antenna configured to receive and transmit radio frequency signals;
a transmit/receive switch configured to pass an amplified radio frequency signal to the antenna for transmission; and
a multi-chip module including a flip chip amplifier die that includes at least one emitter-ballasted amplifier configured to amplify a radio frequency input signal and to generate the amplified radio frequency signal, the at least one emitter-ballasted amplifier including at least one transistor formed over a silicon substrate and a metal pillar formed with respect to the silicon substrate such that a portion of the metal pillar is in direct contact with the silicon substrate, heat generated during operation of the at least one transistor being transferred through the silicon substrate to the portion of the metal pillar, and an output matching network die including an output matching network circuit configured to match an impedance of a fundamental frequency of the amplified radio frequency signal, the flip chip amplifier die further including a first resistor in communication with an emitter of the at least one transistor and the metal pillar.

13. The wireless mobile device of claim 12 wherein the portion of the metal pillar in direct contact with the silicon substrate is a bottom of the metal pillar.

14. The wireless mobile device of claim 12 wherein the metal pillar is configured to provide a flip chip interconnection for the flip chip amplifier die.

15. The wireless mobile device of claim 12 wherein the metal pillar is adjacent to the at least one transistor.

16. The wireless mobile device of claim 12 wherein the metal pillar is formed within a cavity etched into the silicon substrate.

17. The wireless mobile device of claim 16 where the metal pillar protrudes outward and upward from the cavity.

18. The wireless mobile device of claim 12, wherein the flip chip amplifier die further comprises a second resistor in communication with a base of the at least one transistor.

19. The method of claim 9, further comprising forming a second resistor in electrical communication with a base of the at least one transistor.

* * * * *